United States Patent [19]
Waller, Jr.

[11] Patent Number: 5,268,527
[45] Date of Patent: Dec. 7, 1993

[54] AUDIO POWER AMPLIFIER WITH REACTANCE SIMULATION

[76] Inventor: James K. Waller, Jr., Lake Orion, Mich.

[21] Appl. No.: 800,453

[22] Filed: Nov. 25, 1991

[51] Int. Cl.$^5$ .............................................. G10H 1/12
[52] U.S. Cl. .................................. 84/736; 84/DIG. 9; 381/61
[58] Field of Search ............... 381/61, 98, 103; 84/697–700, 736, DIG. 9

[56] References Cited

U.S. PATENT DOCUMENTS

| | | | |
|---|---|---|---|
| 4,046,960 | 9/1977 | Veale | 381/103 |
| 4,382,398 | 5/1983 | O'Neill | 84/DIG. 9 X |
| 4,405,832 | 9/1983 | Sondermeyer | |
| 4,495,640 | 1/1985 | Frey | 381/61 |
| 4,683,589 | 7/1987 | Scholz et al. | 381/61 |
| 4,809,336 | 2/1989 | Pritchard | 381/61 |
| 4,845,758 | 7/1989 | Op de Beek et al. | 381/98 |
| 4,937,874 | 6/1990 | Pittman et al. | 381/61 |
| 4,995,084 | 2/1991 | Pritchard | 389/94 |
| 5,131,044 | 7/1992 | Brown, Sr. et al. | 381/61 |
| 5,133,014 | 7/1992 | Pritchard | 381/61 |
| 5,180,990 | 1/1993 | Ohkuma | 381/98 X |

Primary Examiner—William M. Shoop, Jr.
Assistant Examiner—Jeffrey W. Donels
Attorney, Agent, or Firm—Catalano, Zingerman & McKay

[57] ABSTRACT

A preconditioned signal that is applied to the input of an audio power amplifier for providing a perceived control of reactance simulation (or the Damping Factor) of the amplifier. A low frequency fundamental resonance is combined with a slowly rising high frequency preemphasis to mimic or simulate an audible interaction with the impedance plot of the loudspeaker, without increasing the output impedance of the amplifier.

13 Claims, 3 Drawing Sheets

AUDIO POWER AMPLIFIER WITH REACTANCE SIMULATION

BACKGROUND OF THE INVENTION

The present invention relates generally to musical instrument amplifiers and more particularly concerns a solid-state amplifier designed to achieve a desired sound characteristic associated with the traditional tube-type amplifier.

As popular music has evolved through the past 30 years, so has the equipment used to produce such music. Through the 1960's and 70's, electric guitarists used vacuum tube amplifiers which combined both a preamplifier to achieve a specific, often distorted, guitar sound and a power amplifier to amplify the guitar signal to a level capable of driving guitar speaker cabinets in a single package. The 1980's saw a dramatic change in this philosophy as an increasing number of musical instrument companies began offering pre-amplifiers and power amplifiers as separate packages, thereby often providing more versatility to the musician.

While tube-type amplifiers provided a sound considered desirable to most guitarists, the advent of solid-state technology in the field of instrument amplification boasted many advantages over traditional tube-type designs. Solid-state amplifiers were decidedly more reliable and required far less maintenance than vacuum tube amplifiers. This, coupled with the fact that vacuum tubes themselves are becoming a rarity in all other fields, thereby increasing their cost and making it more difficult to find replacements, has increased the popularity of solid-state amplifiers in recent years.

Even so, the solid-state instrument amplifier has always carried with it a single common criticism that it cannot achieve the rich, warm sound characteristics commonly associated with tube-type guitar amplifiers. Solid-state amplifiers are commonly referred to as being "harsh" or "shrill" sounding. This criticism has spawned many attempts by manufacturers to replicate the "tube sound" with solid-state designs. Nearly all of these designs have been based on the theory that tube type and solid state amplifiers sound distinctly different from one another because a vacuum tube reacts differently when driven into clipping than a transistor. U.S. Pat. No. 4,987,381 recently issued to Brent K. Butler discloses a power amplifier design based on this theory. This patent discloses a hybrid MOSFET/bipolar design which "generates a distorted output signal rich in even harmonics."

It is a myth, however, that a tube generates predominantly even-order harmonics when distorted while a transistor produces predominantly odd-order harmonics. While a vacuum tube may react differently when driven into soft clipping, the hard clipping typically used by guitar players to generate distortion will result in the tube generating equal amounts of even and odd-order harmonics.

The present invention is, therefore, not based on these principles, but instead based on the premise that the high output impedance of a tube-type amplifier results in the impedance response of the guitar speaker having a distinctly audible effect on it's frequency response. Solid-state amplifiers provide a very low output impedance, and therefore the impedance response characteristics of the speaker itself are not audible to the listener. Thus it can be demonstrated that it is not the vacuum tube itself which provides the desirable sound, but rather the interaction of the impedance response and frequency response of the loudspeaker when connected to the high impedance output of a tube-type amplifier. In audio, the relation of an amplifier's output impedance to that of the load connected to its output terminals determines what is referred to as its Damping Factor. The Damping Factor is specified by dividing the load impedance by the output impedance of the amplifier.

Variations in amplitude as small as $\frac{1}{4}$dB can be perceived by the human ear if over a broad enough bandwidth of the audio spectrum. With high fidelity tube amplifiers, an output impedance of as little as 1.5 ohms is considered high, and it's effects on a speaker's impedance response become audibly apparent and influence the listener's perception of subjective characteristics, such as "warmth," "sterility" and the like. Some of the most desirable tube-type guitar amplifiers, on the other hand, provide an output impedance as high as 30–40 ohms, and their interaction with the impedance response of the guitar speaker is therefore considerably greater than that of the Hi Fi amplifier. The result is a steep low-frequency resonance peak at approximately 90 Hz and a gradually rising amplitude above 1 KHz. The sharp boost of the low-frequency peak below 100 Hz is not a major element in the end audible outcome, as the typical guitar speaker cabinet's efficiency below 100 Hz is very poor. The amplitude of the signal may be equally boosted from 20 Hz to 100 Hz with similar results. However, the equally sharp drop above 100 Hz is a key element in producing the desired effect.

Some manufacturers of solid-state amplifiers have also included user-adjustable bass and treble controls to further shape the tone of the signal being amplified. These controls are typically shelving-type and cannot possibly replicate the interaction which takes place between a tube type amplifier and a guitar loudspeaker.

It would be possible to mimic the sound of a tube-type guitar amplifier with a solid-state amplifier by simply adding resistance to the output stage to match the tube amp's output impedance. This would cause a tremendous loss of power, especially considering that the most desirable tube-type guitar amplifiers have tremendously high output impedance ratings. To compensate for this loss by simply increasing the power of the solid-state amplifier would not only prove more costly, but would also produce a far greater degree of unwanted heat.

In view of these existing limitations, it is an object of the present invention to provide the much sought after tube-like sound of a guitar amplifier in a solid-state circuit. A further object of the present invention is to provide the sound of a tube-type amplifier possessing a high output impedance, and therefore mimic or simulate an audible interaction with the impedance plot of the loudspeaker, without increasing the output impedance of the amplifier. It is a further desired object of the present invention to provide a tube-type amplifier sound without alteration of the harmonic information of the amplifier. Yet another object is to provide a means by which the amount of simulated interaction may be defined by the user. And it is an object of the present invention to provide an instrument amplifier system which incorporates a speaker impedance frequency response circuit at the amplifier's input which parallels the impedance response characteristics of the most commonly used guitar loudspeakers.

SUMMARY OF THE INVENTION

In accordance with the invention, an apparatus and process are provided for conditioning an audio signal to simulate the reactance between a guitar speaker and a tube type amplifier. The audio signal is amplified to provide a low impedance signal and the low impedance signal is amplified to provide a first inverted signal. The first inverted signal is reinverted and filtered to produce a second inverted signal having a predetermined fundamental resonance peak. The first inverted signal is also conditioned to produce a pre-emphasized signal having a predetermined rising high frequency level above approximately 1 KHz. This said second inverted signal is then weighted in relation to the pre-emphasized signal and combined with the pre-emphasized signal to produce a composite reinverted signal having the predetermined fundamental resonance peak and rising high frequency level.

BRIEF DESCRIPTION OF THE DRAWINGS

Other objects and advantages of the invention will become apparent upon reading the following detailed description and upon reference to the drawings in which.

While the invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

DETAILED DESCRIPTION

Figure 1:
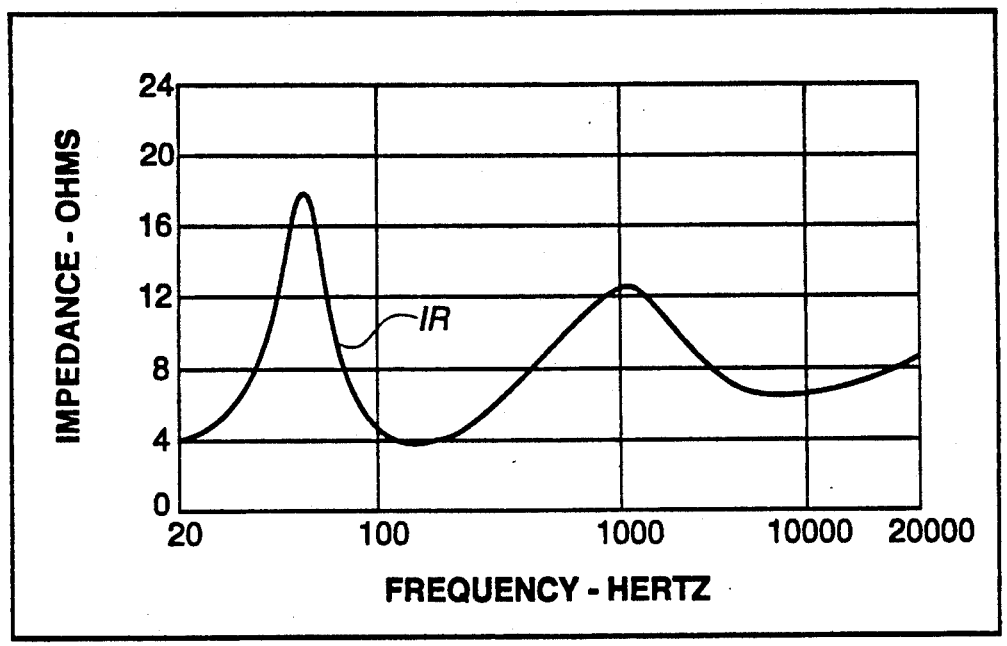
FIG. 1 is a graphic representation of the impedance response of a typical 8-ohm high fidelity speaker system.

The impedance response IR of a typical 8-ohm high fidelity speaker system is shown in FIG. 1. Because the impedance response of high fidelity speakers can vary considerably from system to system, the present invention could not provide an accurate simulation of the interaction between the tube amplifier's high output impedance and the impedance response of the speaker in Hi Fi applications. The impedance characteristics of high fidelity speaker systems will change dramatically from system to system because of the tremendous variety of speakers that are available for high fidelity applications. This change is further dramatized because most high fidelity speaker systems also combine different speakers into a single system to achieve optimal low, mid and high band audio. The combination of the woofer and midrange in a Hi Fi system produces fundamental resonance peaks at various frequencies in the mid band.

Figure 2:
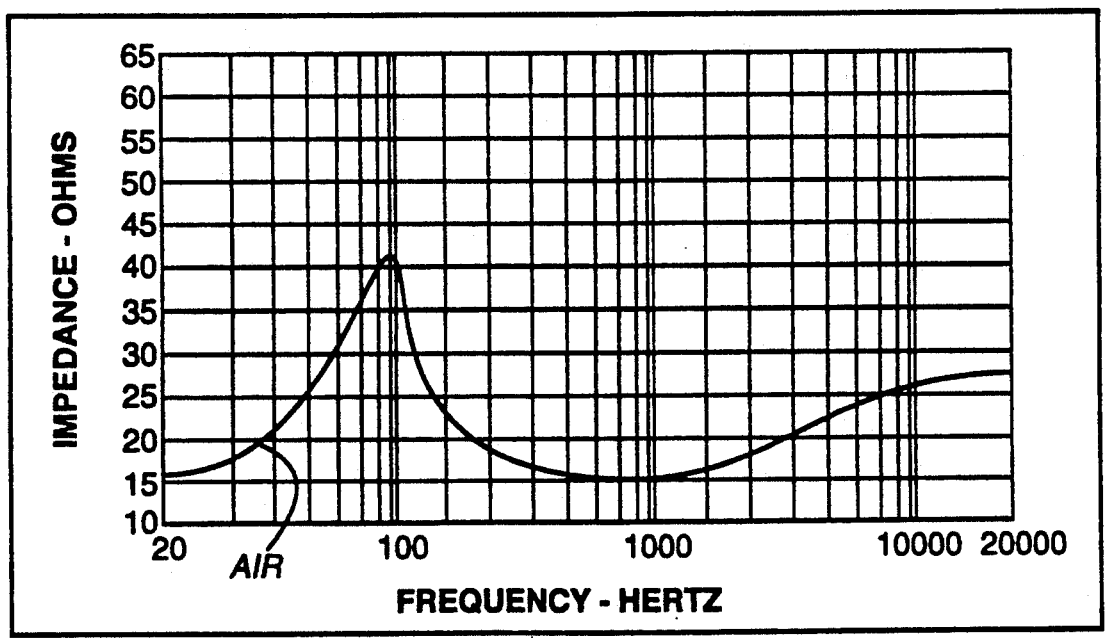
FIG. 2 is a graphic representation of the average impedance response of a typical speaker system designed for guitar.

On the other hand, frequency and impedance specifications of speaker systems designed specifically for guitar applications will vary only a minimal amount. Electric guitarists generally connect the output of their amplifier to a speaker cabinet containing one, two or four identical 12" speakers. One of the most popular speakers used in electric guitar applications has been manufactured by a company named Celestion, and because of its long-standing popularity, most companies which manufacture speakers designed for use with guitar amplifiers provide similar frequency and impedance response characteristics as Celestion. Therefore, a single speaker impedance frequency response circuit may be used to simulate virtually any speaker intended for guitar applications. FIG. 2 illustrates an average impedance response AIR typical of most guitar loudspeakers.

Figure 3:
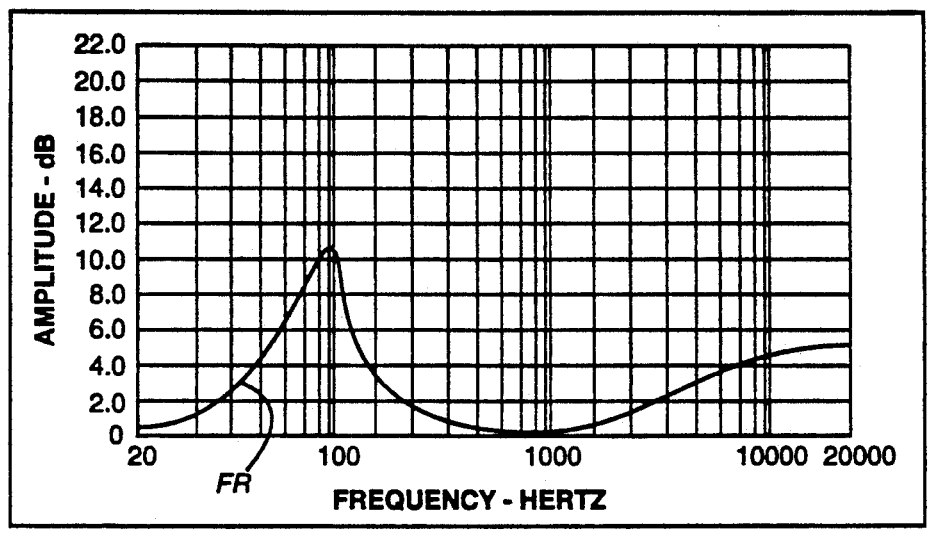
FIG. 3 is a graphic representation of the average frequency response of a typical speaker system designed for guitar when connected to the high impedance output of a tube amplifier.

In most cases, connecting the output of a tube amplifier to a purely resistive load or to no load will result in a ruler flat frequency response measured at the output. The same is true of a solid-state amplifier, as solid-state amplifiers typically have output impedances measuring far less than 1 ohm. However, connecting the high impedance output of a tube amplifier to a speaker will result in an interaction between the speaker and the amplifier which then provides a frequency response which mimics the impedance plot of the speaker when measured at the speaker terminals or audibly transduced into air. This is because the actual measurable impedance of the speaker will rise at both its fundamental resonance frequency and also at high frequencies due to the inductive characteristics of the speaker. The tube amplifier will therefore provide a higher output voltage to the speaker where it has a rising impedance. When using a solid-state amplifier, this condition does not exist. Therefore you can characterize the frequency response that the tube amplifier has when it is interacting with the speaker by simply measuring that frequency response at the speaker terminals, sweeping from 20 Hz to 20 KHz. Such a frequency response FR is illustrated in FIG. 3. Once that frequency response has been defined, it can be characterized in a circuit which simulates the reactance between the speaker and tube amplifier.

Figure 4:
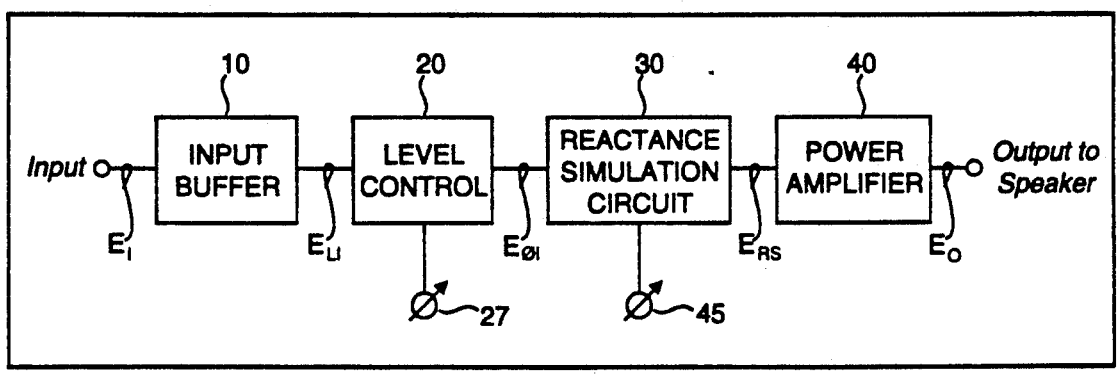
FIG. 4 is a block diagram of a preferred embodiment of the present invention.

FIG. 4 illustrates the preferred embodiment of the present invention, wherein the input signal $E_I$ is processed by an input buffer 10, followed by a level control 20. The output of the level control 20 $E_{\phi I}$ is then fed to the input of a reactance simulation circuit 30 before being applied to a power amplifier 40 to produce an signal E to a speaker.

Figure 5:
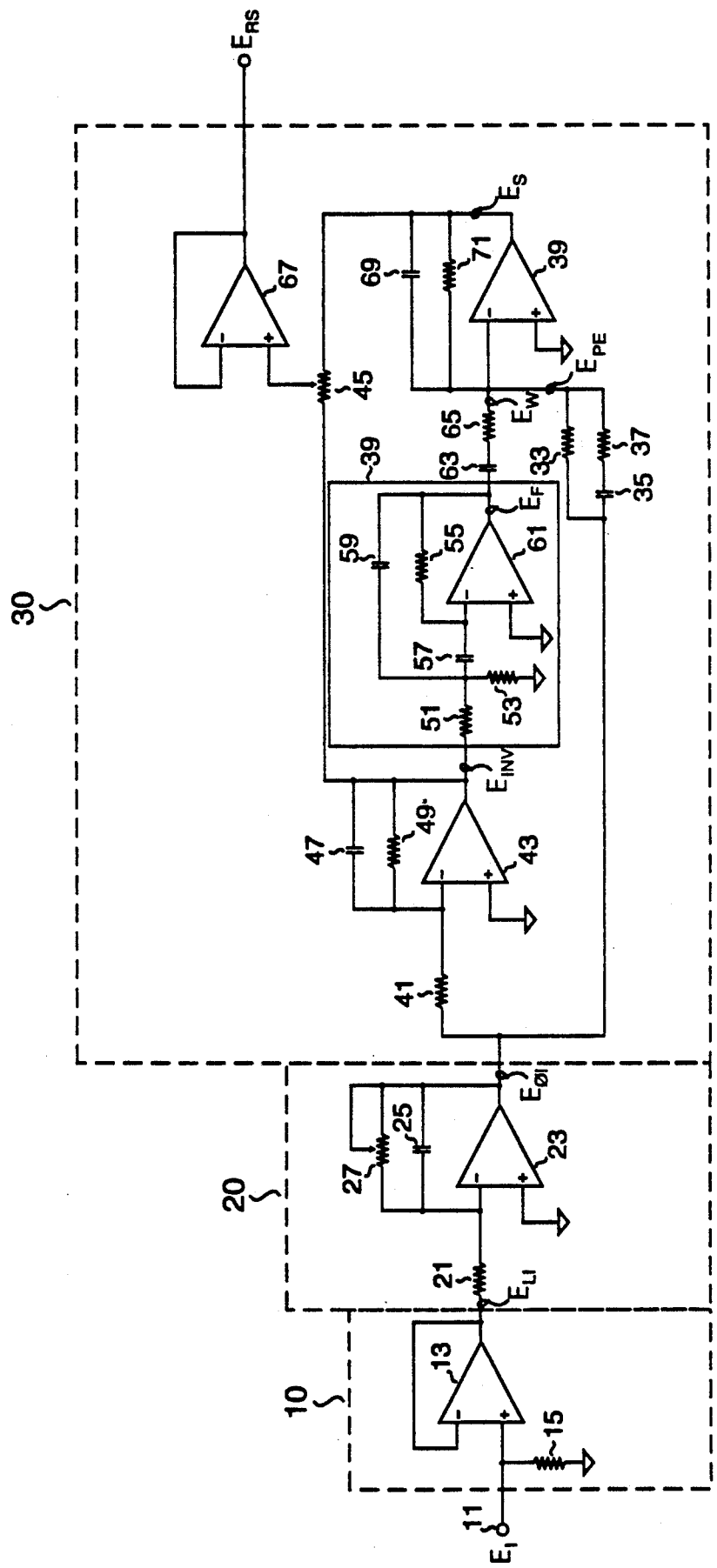
FIG. 5 is a schematic diagram of a preferred embodiment of the present invention.

Now referring to FIG. 5, an input signal E is applied to the input buffer circuit 10 at input terminal 11. An operational amplifier 13 provides a low impedance output $E_I$ to drive the level control circuit 20. A resistor 15 provides bias for the operational amplifier 13 and also sets the input impedance of the network. The output $E_{LI}$ of the operational amplifier 13 feeds through an input resistor 21 to the level control amplifier 23. A capacitor 25 provides improved stability for the level control amplifier 23, due to the fact that the level control 20 can be set so that the level control amplifier 23 has a gain of less than unity. A variable resistor 27 permits adjustment of the level of the input signal $E_{LI}$ to the level control amplifier 23 from $-\infty$ to approximately 12 dB. The level control circuit 20 provides the gain adjustment for the input signal $E_{LI}$ and feeds a signal $E_{\phi I}$ that is phase-inverted from the original input signal $E_I$ to the input of the reactance simulation circuit 30. The reactance simulation circuit provides a fundamental resonance peak at approximately 85 Hz and also provides a rising high frequency level above 1 KHz as shown in FIG. 2. The level control amplifier 23 feeds a high frequency pre-emphasis network comprised of a first resistor 33 connected in parallel with a capacitor 35 and a second resistor 37. The resulting pre-emphasis signal E is applied to the negative input of a summing amplifier 39 and provides the rising high frequency increase above 1 KHz as can be seen in FIG. 2. The summing amplifier 39 provides phase-inversion and, due to the fact that the output signal $E_{\phi I}$ of the level control amplifier 23 is phase-inverted relative to the original input signal $E_I$, this results in phase coherence between the input signal $E_I$ and the output signal $E_S$ of the summing amplifier 39. The level control amplifier 23 also feeds through a resistor 41 to the negative input of an inverting amplifier 43 which corrects the phase inversion which takes place in the level control circuit 20. The output $E_{INV}$ of the inverting amplifier 43 feeds one side of a variable resistor 45 which provides adjustment control for the reactance simulation circuit 30, allowing the user to select from no reactance simulation to maximum reactance simulation. Also associated with the inverting amplifier 43 are a stabilizing capacitor 47 and gain setting feedback resistor 49.

The output $E_{INV}$ of the inverting amplifier 43 is also fed to a network 50 which is a bandpass filter set at the fundamental resonance frequency desired based on the characteristics of the loudspeaker simulated. The Q of this bandpass filter is approximately 1.8. The network 50 forms a multiple feedback bandpass filter circuit in which first and second resistors 51 and 53 combine with a feedback resistor 55 to define the Q of the filter. Two capacitors 57 and 59, in combination with the resistors 51, 53 and 55, define the center frequency of the bandpass filter. An amplifier 61 provides the filter output $E_F$, which is applied to an AC coupling capacitor 63 which is used for the purpose of blocking any DC signal which may be present in the output $E_F$ of the bandpass filter 50. A resistor 65 determines the weighting of the output signal $E_F$ from the bandpass circuit 50 relative to the high frequency pre-emphasized signal $E_{PE}$. The value of the weighting resistor 65 will determine the amount of boost at the fundamental resonance frequency, or the low frequency peak as shown in FIG. 2. The summing amplifier 39 combines the pre-emphasized output signal $E_{PE}$ and the weighted output $E_W$ to provide the low frequency resonance peak and the rising high frequency signal. The summing amplifier 39 is stabilized by a capacitor 69 and its gain is set in part by a feedback resistor 71. The bandpass filter 50 also inverts the phase of its input signal $E_{INV}$, yet due to the subsequent phase-inversion at the summing amplifier 39, phase-coherence is restored between the input signal $E_1$ and the output $E_S$ of the summing amplifier 39. The output of the variable resistor 45 is buffered by another amplifier 67, which provides the output signal $E_{RS}$ to be applied to the input of the power amplifier circuit 40. The potentiometer 45 allows user adjustment of the perceived Damping Factor of the amplifier 67.

Thus, it is apparent that there has been provided, in accordance with the invention, an audio power amplifier with reactance simulation that fully satisfies the objects, aims and advantages set forth above. While the invention has been described in conjunction with specific embodiments thereof, it is evident that many alternatives, modifications and variations will be apparent to those skilled in the art and in light of the foregoing description. Accordingly, it is intended to embrace all such alternatives, modifications and variations as fall within the spirit of the appended claims.

What is claimed is:

1. A circuit for conditioning an audio signal comprising:
   means for filtering said audio signal to produce a first signal having a predetermined fundamental resonance peak;
   means for pre-emphasizing said audio signal to produce a second signal having a predetermined rising high frequency level above approximately 1 KHz; and
   means for combining said first and second signals to produce a composite signal having said predetermined fundamental resonance peak and said predetermined rising high frequency level simulating the reactance between a guitar speaker and a tube type amplifier.

2. A circuit according to claim 1, said predetermined fundamental resonance peak occurring at approximately 85 Hz.

3. A circuit for conditioning a line level audio signal to simulate the reactance between a guitar speaker and a tube type amplifier comprising:
   means for amplifying said audio signal to provide a low impedance signal;
   means for amplifying said low impedance signal to provide a first inverted signal;
   means for amplifying said first inverted signal to produce a reinverted signal;
   means for filtering said reinverted signal to produce a second inverted signal having a predetermined fundamental resonance peak;
   means for conditioning said first inverted signal to produce a pre-emphasized signal having a predetermined rising high frequency level above approximately 1 KHz;
   means for weighting said second inverted signal in relation to said pre-emphasized signal to provide a weighted signal; and
   means for combining said pre-emphasized and weighted signals to produce a composite reinverted signal having said predetermined fundamental resonance peak and said predetermined rising high frequency level.

4. A circuit according to claim 3, said means for amplifying said low impedance signal having a means for user varying the level of said low impedance signal.

5. A circuit according to claim 4, said low impedance signal level being user variable from approximately 0 to 12 dB.

6. A circuit according to claim 3 further comprising means connected between said reinverted signal and said composite reinverted signal to provide a user variable signal ranging from said reinverted signal to said composite reinverted signal.

7. A circuit according to claim 3, said predetermined fundamental resonance peak occurring at approximately 85 Hz.

8. A process for conditioning an audio signal comprising the steps of:
   filtering said audio signal to produce a first signal having a predetermined fundamental resonance peak;
   pre-emphasizing said audio signal to produce a second signal having a predetermined rising high frequency level above approximately 1 KHz; and combining said first and second signals to produce a composite signal having said predetermined fundamental resonance peak and said predetermined rising high frequency level simulating the reactance between a guitar speaker and a tube type amplifier.

9. A process according to claim 8, said predetermined fundamental resonance peak occurring at approximately 85 Hz.

10. A process for conditioning a line level audio signal to simulate the reactance between a guitar speaker and a tube type amplifier comprising the steps of:
   amplifying said audio signal to provide a low impedance signal;
   amplifying said low impedance signal to provide a first inverted signal;
   amplifying said first inverted signal to produce a first reinverted signal;
   filtering said reinverted signal to produce a second inverted signal having a predetermined fundamental resonance peak;
   conditioning said first inverted signal to produce a pre-emphasized signal having a predetermined rising high frequency level above approximately 1 KHz;
   weighting said second inverted signal in relation to said pre-emphasized signal to provide a weighted signal; and
   combining said pre-emphasized and weighted signals to produce a composite reinverted signal having said predetermined fundamental resonance peak and said predetermined rising high frequency level.

11. A circuit according to claim 10, said low impedance signal level being user variable from approximately 0 to 12 dB.

12. A circuit according to claim 10 further comprising the step of user variably combining said reinverted signal and said composite reinverted signal to provide a signal ranging from said reinverted signal to said composite reinverted signal.

13. A circuit according to claim 10, said predetermined fundamental resonance peak occurring at approximately 85 Hz.

* * * * *